(12) United States Patent
Endoh et al.

(10) Patent No.: US 7,378,683 B2
(45) Date of Patent: May 27, 2008

(54) TRANSISTOR USING ORGANIC MATERIAL HAVING A BRIDGED CYCLIC HYDROCARBON LACTONE STRUCTURE AND PROCESS FOR PRODUCING THE SAME

(75) Inventors: Hiroyuki Endoh, Tokyo (JP); Etsuo Hasegawa, Tokyo (JP); Satoru Toguchi, Tokyo (JP); Katsumi Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 328 days.

(21) Appl. No.: 11/103,267

(22) Filed: Apr. 11, 2005

(65) Prior Publication Data

US 2005/0230680 A1 Oct. 20, 2005

(30) Foreign Application Priority Data

Apr. 15, 2004 (JP) .............................. 2004-120117

(51) Int. Cl.
*H01L 29/08* (2006.01)
*H01L 51/40* (2006.01)
(52) U.S. Cl. .......................... 257/40; 257/410; 438/99; 438/287
(58) Field of Classification Search .................. 257/40, 257/E51.027, E51.003, 410; 526/280; 438/99, 438/287
See application file for complete search history.

(56) References Cited

U.S. PATENT DOCUMENTS 5,093,691 A * 3/1992 Utsugi et al. .................. 257/40
5,355,235 A * 10/1994 Nishizawa et al. ........... 349/43

(Continued)

FOREIGN PATENT DOCUMENTS

JP 5-55568 3/1993

(Continued)

OTHER PUBLICATIONS

Ebisawa, F., et al., "Electrical properties of polyacetylene/polysiloxane interface", Journal of Applied Physics (1983), vol. 54, pp. 3255-3259.

(Continued)

*Primary Examiner*—Mark Prenty
(74) *Attorney, Agent, or Firm*—Scully, Scott, Murphy & Presser, P.C.

(57) ABSTRACT

An organic thin film transistor having an insulator layer formed of a polymer compound having a repeat unit represented by the following formula [1] is disclosed:

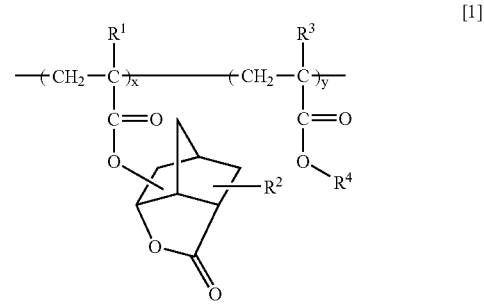

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying $x+y=1$, $0<x\leq 1$ and $0\leq y<1$.

11 Claims, 1 Drawing Sheet

U.S. PATENT DOCUMENTS

| | | | | |
|---|---|---|---|---|
| 5,612,228 | A | * | 3/1997 | Shieh et al. ............... 438/99 |
| 5,705,826 | A | * | 1/1998 | Aratani et al. ............. 257/40 |
| 5,854,139 | A | * | 12/1998 | Aratani et al. ............ 438/780 |
| 6,060,338 | A | * | 5/2000 | Tanaka et al. ............. 438/99 |
| 6,335,539 | B1 | * | 1/2002 | Dimitrakopoulos et al. .. 257/40 |
| 7,029,945 | B2 | * | 4/2006 | Veres et al. ............... 438/99 |
| 7,186,495 | B2 | * | 3/2007 | Maeda et al. ............ 430/270.1 |
| 2003/0227014 | A1 | * | 12/2003 | Murti et al. .............. 257/40 |
| 2004/0232411 | A1 | * | 11/2004 | Nakamura ................ 257/40 |
| 2005/0017237 | A1 | * | 1/2005 | Ong et al. ................ 257/40 |
| 2005/0056828 | A1 | * | 3/2005 | Wada et al. .............. 257/40 |
| 2006/0118777 | A1 | * | 6/2006 | Hirakata et al. ........... 257/39 |
| 2006/0192197 | A1 | * | 8/2006 | Koganei ................... 257/40 |
| 2006/0231827 | A1 | * | 10/2006 | Hanato et al. ............. 257/40 |

FOREIGN PATENT DOCUMENTS

| | | |
|---|---|---|
| JP | 8-228034 | 9/1996 |
| JP | 8-228035 | 9/1996 |
| JP | 9-232589 | 9/1997 |
| JP | 10-125924 | 5/1998 |
| JP | 10-190001 | 7/1998 |
| JP | 2000-174277 | 6/2000 |
| JP | 3145294 | 1/2001 |
| JP | 2001-94107 | 4/2001 |

OTHER PUBLICATIONS

Peng, Xuezhou, et al., "All-organic thin-film transistors made of alpha-sexithienyl semiconducting and various polymeric insulating layers", Applied Physics Letter (1990), vol. 57, pp. 2013-2015.

Garnier, Francis, et al., "All-Polymer Field-Effect Transistor Realized by Printing Techniques", Science (1994), vol. 265, pp. 1684-1686.

Kudo, Kazuhiro, et al., "Schottky gate static induction transistor using copper phthalocyanine films", Thin Solid Films (1998), vol. 331, pp. 51-54.

* cited by examiner

TRANSISTOR USING ORGANIC MATERIAL HAVING A BRIDGED CYCLIC HYDROCARBON LACTONE STRUCTURE AND PROCESS FOR PRODUCING THE SAME

BACKGROUND OF THE INVENTION

1. Field of the Invention

The present invention relates to a thin film transistor having a semiconductor layer of an organic material or an inorganic material, and more specifically relates to an organic thin film transistor using an organic material, which can afford a thin layer transistor having high mobility and an excellent on-off property.

2. Description of the Related Art

Thin film transistors are widely used as a switching element for display in display devices such as liquid crystal display. Conventionally, thin film transistors (hereinafter also referred to as TFT) have been produced by using amorphous or polycrystalline silicon. CVD apparatuses for fabricating such TFT using silicon, however, are extremely expensive and thus fabrication of large-sized display devices using a TFT involved a problem of a remarkable increase in the fabrication cost. In addition, since the film forming process of amorphous or polycrystalline silicon is conducted at an extremely high temperature, there has been a problem that the kind of materials usable for a substrate has been limited and a lightweight resin substrate, for example, cannot be used.

In order to solve the above-mentioned problems, TFTs using an organic material instead of amorphous or polycrystalline silicon have been proposed. As a film forming method for forming a TFT by using an organic material, a vacuum deposition method and a coating method are known. According to these film forming methods, fabrication of large devices can be carried out while suppressing the cost increase, and the processing temperature required in the film forming process can be set to a relatively low temperature. Accordingly, TFTs using an organic material have an advantage that the limitation when choosing the material for the substrate is small, and thus practical application of such TFT is expected.

Recently, an increasing number of reports on TFTs using an organic material have been practically made (e.g., F. Ebisawa et al., Journal of Applied Physics, vol. 54, p 3255, 1983; X. Peng et al., Applied Physics Letter, vol. 57, p 2013, 1990; F. Garnier et al., Science, vol. 265, p 1684, 1994; K. Kudo, Thin Solid Films, vol. 331, p 51, 1998; etc.).

As an organic material used for an organic compound layer of a TFT, polymers such as a conjugated polymer and a thiophene (Japanese Patent Application Laid-Open No. 8-228034, Japanese Patent Application Laid-Open No. 8-228035, Japanese Patent Application Laid-Open No. 9-232589, Japanese Patent Application Laid-Open No. 10-125924, Japanese Patent Application Laid-Open No. 10-190001), a metal phthalocyanine compound (Japanese Patent Application Laid-Open No. 2000-174277) and a fused aromatic hydrocarbon such as pentacene (Japanese Patent Application Laid-Open No. 5-55568, Japanese Patent Application Laid-Open No. 2001-94107) are used alone or in a mixture with other compounds.

With the use of an organic material as a material for a semiconductor layer, it has become possible to use resins or plastics for a substrate of such devices, in addition to hard materials such as glass, which successfully led to flexibility of the whole device, and thus flexible organic TFTs are now being actively studied.

Further, since a coating process using a solution can be adopted as a process for producing an organic TFT, fabrication methods aimed at low cost, which employ a coating process or a printing process, are also being studied extensively.

FIG. 1 shows a cross-sectional structure of a typical organic TFT. The organic TFT-A has a gate electrode (layer) 14 and an insulator layer 16 on a substrate 11 in that order, and a source electrode 12 and a drain electrode 13 are formed on the insulator layer 16 at a predetermined interval of space. An organic semiconductor layer 15 is formed on the insulator layer 16 exposed between the electrodes 12 and 13 so as to include part of surfaces of the electrodes 12 and 13. In an organic TFT-A having such structure, the organic semiconductor layer 15 forms a channel region, and a voltage applied to the gate electrode 14 controls the electric current flowing between the source electrode 12 and the drain electrode 13 to operate on/off.

When the above-mentioned organic TFT-A is formed by coating and printing processes to fabricate a flexible device, formation of a substrate 11, an insulator layer 16 and an organic semiconductor layer 15 is important. In particular, the properties and characteristics of the insulator layer have a great influence on the performance of the organic TFT as a whole. If the insulator layer has poor resistance to electricity, leak current may be generated from the gate electrode, causing property deterioration of the organic TFT, which may result in breakdown of the element in worst cases. In addition, when forming an organic semiconductor layer by a coating process after forming an insulator layer by a coating process, the solvent dissolving the organic semiconductor material may dissolve the insulator layer, and thus fabrication of element is often impossible. Conventionally, since acrylic polymers (poly methylmethacrylate (PMMA), etc.) used as an insulator layer material dissolves relatively well in various solvents, it has been difficult to form an organic semiconductor layer by a coating process after forming a thin film of an insulator layer by a coating process. Thus, a dry process such as a vacuum deposition method is often used to fabricate an element. For such reason, development of an organic insulator layer material difficult to dissolve in a solvent is underway, but no satisfactory material has been found except for limited materials such as polyimide. Polyimide has an excellent insulating property and polyamic acid, a precursor thereof, has an excellent dissolution property. However, because a reaction from a thin film of polyamic acid, which is the precursor, to a thin film of polyimide must be conducted on a substrate, a process such as heating is required, and thus improvement is required in simplification of the process.

SUMMARY OF THE INVENTION

In view of the above circumstances, an object of the present invention is to provide an organic thin film transistor which is high in mobility and excellent in on-off property by using a material which involves a simple film forming process and which is resistant to a process for forming an organic semiconductor thin film layer after forming an insulator layer.

The inventors of the present invention have conducted intensive studies to solve the above-mentioned problems and have found that the mobility and the on-off property of an organic thin film transistor are remarkably improved by using, as a material for an organic insulator layer, an organic material having a bridged cyclic hydrocarbon lactone structure for the insulator layer of the organic transistor, which resulted in the completion of the present invention.

The first invention according to the present invention is a transistor which has three electrodes and in which an electric current flowing between a first electrode and a second electrode is controlled by applying a voltage to a third electrode, the transistor comprising an organic material having a bridged cyclic hydrocarbon lactone structure.

The organic material having a bridged cyclic hydrocarbon lactone structure is a polymer compound represented by the formula [1]:

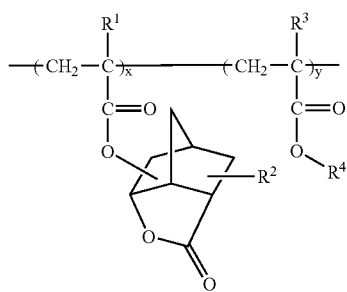

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar-ratio and are any number satisfying $x+y=1$, $0<x\leqq1$ and $0\leqq y<1$.

In addition, the polymer compound represented by the formula [1] may be a compound in which $y=0$.

Furthermore, the gate insulator layer is formed of an organic material having a bridged cyclic hydrocarbon lactone structure.

Also, the semiconductor material is an organic material.

The second invention according to the present invention is an organic thin film transistor comprising a third electrode and an insulator layer on a substrate in that order, a first electrode and a second electrode formed on the insulator layer at a predetermined interval of space, and an organic semiconductor layer formed on the insulator layer exposed between the first electrode and the second electrode so as to include part of a surface of the first electrode and the second electrode, wherein the insulator layer is formed of a polymer compound represented by the formula [1].

The third invention according to the present invention is an organic thin film transistor comprising a third electrode, an insulator layer and an organic semiconductor layer on a substrate in that order, and a first electrode and a second electrode formed on the organic semiconductor layer at a predetermined interval of space, wherein the insulator layer is formed of a polymer compound represented by the formula [1].

The fourth invention according to the present invention is an organic thin film transistor comprising a third electrode and an insulator layer on a substrate in that order, a first electrode formed on the insulator layer, an organic semiconductor layer formed on the first electrode and the insulator layer exposed so as to include part of a surface of the first electrode, and a second electrode formed on the organic semiconductor layer, wherein the insulator layer is formed of a polymer compound represented by the formula [1].

The fifth invention according to the present invention is an organic thin film transistor comprising an organic semiconductor layer, a first electrode and a second electrode which are in contact with each surface of the organic semiconductor layer and formed to be faced with each other at a predetermined interval of space, and a third electrode formed in a pre-determined distance from the first and the second electrodes, wherein an insulator layer is formed on some or all part of the periphery of the third electrode and wherein the insulator layer is formed of a polymer compound represented by the formula [1].

The present invention also includes a process for producing an organic thin film transistor of which an insulator layer is formed of a polymer compound represented by the formula [1], wherein the insulator layer is formed by using a solution of the polymer compound represented by the formula [1].

The organic semiconductor layer may be formed by using a solution of the organic semiconductor material.

In the present invention, since an organic material having a bridged cyclic hydrocarbon lactone structure, specifically, a polymer compound represented by the formula [1] is used, lamination of layers utilizing a difference in the solvent solubilities is possible, and thus when forming an insulator layer of an organic thin film transistor and forming an organic semiconductor layer thereon, the film forming process becomes simple and accurate, and an organic thin film transistor having high mobility and an excellent on-off property can be afforded.

DETAILED DESCRIPTION OF THE PREFERRED EMBODIMENTS

Figure 1:
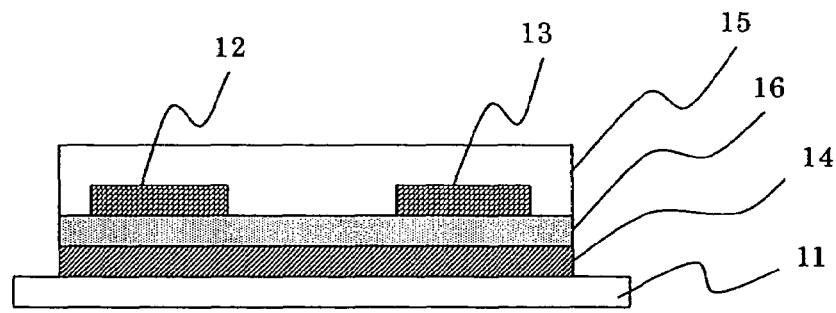
FIG. 1 is a schematic cross-sectional view illustrating the structure of the first embodiment (organic TFT-A)

The present invention is directed to a transistor in which an electric current flowing between a first electrode and a second electrode is controlled by applying a voltage to a third electrode. Specific examples thereof include transistors having a field effect transistor (FET) structure shown in FIGS. 1 to 3 and transistors having a static induction transistor (SIT) structure shown in FIG. 4 described below. Specifically, the transistor has a source electrode (first electrode) and a drain electrode (second electrode), and a gate electrode (third electrode) for controlling the electric current flowing between the electrodes by applying a voltage. A semiconductor layer is formed between the first electrode and the second electrode, which may be an inorganic or organic semiconductor, but in the present invention, an organic semiconductor is desirable. In addition, the third electrode controls the amount of current flowing between the first electrode and the second electrode. Since current leakage from the third electrode and the resulting short circuit with the first electrode or the second electrode are undesirable, an insulator layer (gate insulator layer) is generally formed on the third electrode. In the present invention, the insulator layer is preferably made of an organic material.

The present invention is characterized in that an organic material having a bridged cyclic hydrocarbon lactone structure is contained in the transistor. The organic material having a bridged cyclic hydrocarbon lactone structure means a material which has a structure in which a bridged cyclic hydrocarbon compound having not less than two cyclic structures which share not less than two carbon atoms, such as bicyclo[2.2.1]heptane and bicyclo[3.2.1]octane is further condensed with a lactone structure which is a cyclic carboxylate ester. The material is preferably a polymer compound represented by the formula [1].

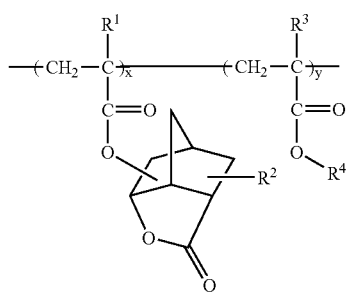

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying $x+y=1$, $0<x\leq1$ and $0\leq y<1$.

Particularly, since the polymer compound represented by the above formula [1] is insoluble in ether solvents such as tetrahydrofuran (THF) and diethyl ether, aromatic hydrocarbon solvents such as toluene and xylene, alcohol solvents such as methanol and ethanol and water, high mobility and a high on-off property can be achieved without redissolution or corrosion of an insulator layer by selecting these solvents when forming an insulator layer from the polymer compound and forming an organic semiconductor layer thereon.

Further, since the polymer compound represented by the formula [1] is soluble in limited kinds of solvents such as chloroform, γ-butyrolactone and N,N-dimethylformamide, a solution with a sufficient concentration can be prepared when forming an insulator layer, and so various printing processes and coating processes are applicable.

Of the polymer compounds represented by the formula [1], those in which $y\neq0$ have a greater solubility in various solvents than those in which $y=0$, and thus it becomes easy to increase the concentration of the solute in the solution, to increase the film thickness and to control the viscosity when applying a printing process. In this regard, since a greater y value results in too high a solubility in the solvent, $x>y$ is desirable in view of the solubility. Even in the case of $x<y$, however, an intended device can be fabricated as long as properties as an insulating film are sufficiently maintained and the insulator layer is not eroded when forming an organic semiconductor layer.

The weight average molecular weight of the polymer compound represented by the formula [1] is not particularly limited, but is preferably in the range of 2,000 to 1,000,000. In this case, the greater the molecular weight, the higher the insulating property and the lower the solubility in the solvent, whereby redissolution in the solvent can be further prevented. However, because it also becomes difficult to prepare a solution for forming a thin film, a compound having a weight average molecular weight of 5,000 to 500,000 is more preferably used.

The polymer compound represented by the formula [1] can be obtained according to a method described in Japanese Patent No. 3042618.

In the following, the present invention is described in more detail based on embodiments referring to the figures. FIGS. 1 to 4 are cross-sectional views illustrating structures of organic TFTs according to the embodiment of the present invention.

Figure 2:
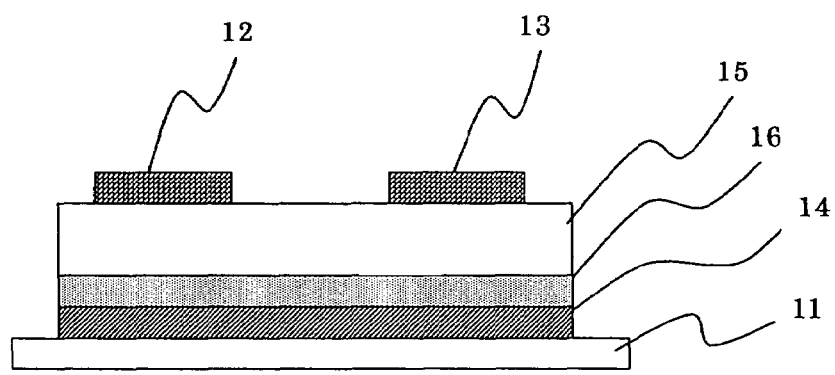
FIG. 2 is a schematic cross-sectional view illustrating the structure of the first embodiment (organic TFT-B)
Figure 3:
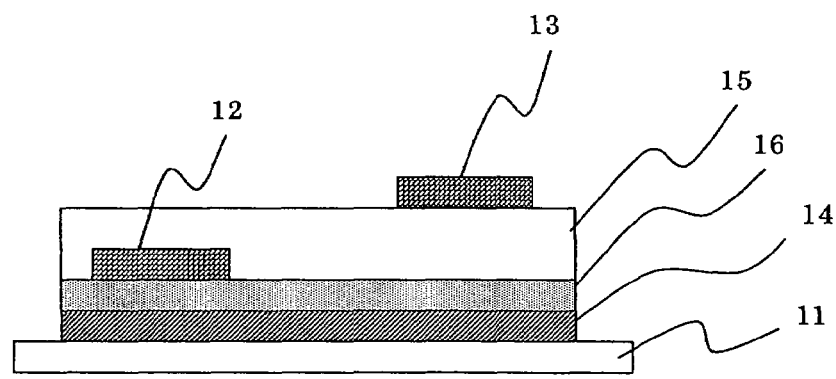
FIG. 3 is a schematic cross-sectional view illustrating the structure of the first embodiment (organic TFT-C)

The first embodiment, which is an organic TFT having a field effect transistor (FET) structure, includes a number of embodiments in which the position of the electrodes is different with reference to the insulator layer and the semiconductor layer. Typical examples thereof are shown in FIGS. 1 to 3 in a schematic cross-sectional view. Each is represented as organic TFT-A, organic TFT-B and organic TFT-C.

The organic TFTs-A to C have an organic semiconductor layer 15, a source electrode (first electrode) 12 and a drain electrode (second electrode) 13 formed to be faced with each other at a predetermined interval of space and a gate electrode (third electrode) 14 formed at a pre-determined distance from the electrodes 12 and 13, and have a structure for controlling an electric current flowing between the source electrode 12 and the drain electrode 13 by applying a voltage to the gate electrode 14. In the organic TFT-A, the electrodes 12 and 13 are formed directly on the gate insulator layer 16, while in the organic TFT-B, the electrodes 12 and 13 are formed on the organic semiconductor layer 15, and in the organic TFT-C, the electrode 12 is formed under the organic semiconductor layer 15 and the electrode 13 is formed on the organic semiconductor layer 15 (in the last instance, the electrodes 12 and 13 may be oppositely positioned).

The material that can be used for the substrate 11 includes inorganic materials such as glass and silicon, and plastics such as acrylic resins, which are not particularly limited as long as the material can support the organic TFT formed thereon. In addition, when the structure of the organic TFT can be maintained sufficiently by a constituent member other than the substrate, the substrate may not be used.

The materials that can be used each independently for the electrodes 12, 13 and 14 include, but not limited to, conductive metal oxides such as indium tin oxide (ITO) and tin oxide (NESA), metals such as gold, silver, platinum, copper, indium, aluminum and magnesium, alloys such as magnesium-indium alloy, magnesium-aluminum alloy, aluminum-lithium alloy, aluminum-scandium-lithium alloy and magnesium-silver alloy and organic materials such as conductive polymers.

The compound contained in the organic semiconductor layer 15 is not particularly limited as long as the compound has a semiconductor property, and examples thereof include fused polycyclic aromatic compounds such as tetracene and pentacene, phthalocyanine compounds such as copper phthalocyanine and zinc phthalocyanine, amine compounds and polymers such as polythiophene and polyvinyl carbazole.

As the method of preparing the electrodes 12, 13 and 14, usual electrode formation processes such as a vacuum deposition method, a sputtering method, an etching method and a lift-off method can be used without any particular limitation. When using an organic material such as a conductive polymer as an electrode, solution processes such as a spin coat method and a dip method may also be used without any particular limitation.

As the method of forming an organic semiconductor layer 15, solution processes such as a spin coat method and a dip method may also be used without any particular limitation in addition to dry processes such as a vacuum deposition method. In the present invention, since the polymer compound represented by the formula [1] is used as an insulator layer, a solution of an organic semiconductor compound may be used by selecting an appropriate solvent, and so a solution process without use of heat can be suitably employed.

Figure 4:
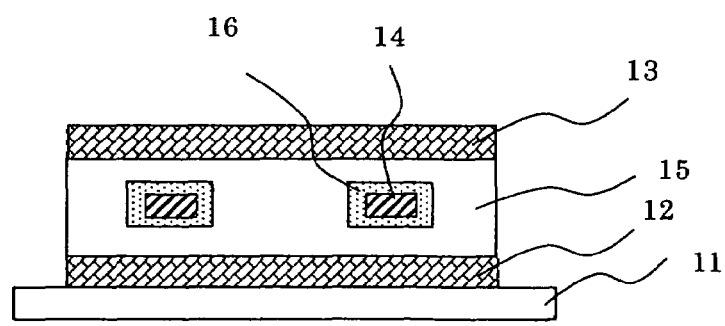
FIG. 4 is a schematic cross-sectional view illustrating the structure of the second embodiment (organic TFT-D).

The second embodiment includes an organic TFT having a static induction transistor (SIT) structure, of which the schematic cross-sectional view is shown in FIG. 4. The present embodiment is represented as organic TFT-D.

The organic TFT-D has a source electrode (first electrode) 12 and a drain electrode (second electrode) 13 which are formed in contact with different surfaces 15*a* and 15*b* of the organic semiconductor thin film layer 15 to be faced with each other at a predetermined interval of space. A gate electrode (third electrode) 14 is formed inside the organic semiconductor thin film layer 15 at a pre-determined distance from the electrodes 12 and 13. The organic TFT-D also has a structure for controlling an electric current flowing between the source electrode 12 and the drain electrode 13 by applying a voltage to the gate electrode 14. An insulator layer 16 is formed around the gate electrode 14.

The materials that can be used for the substrate 11, the electrodes 12, 13 and 14 and the organic semiconductor thin film layer 15, and the preparation method of each component in the organic TFT-D of this Embodiment are the same as those in Embodiment 1.

The film thickness of the organic semiconductor thin film layer 15 in the organic TFTs-A to D is not particularly limited. Generally, however, when the film thickness is too small, defects such as pinholes are easily caused, while when it is too large, the channel length is extended and a high voltage must be applied, which may cause deterioration of performance of TFT. For such reason, the film thickness preferably ranges from several nm to 1 μm.

EXAMPLES

In the following, the present invention is described in detail by means of Examples, but the present invention is not limited to the Examples as long as they do not go beyond the scope of the present invention.

The polymer compound of the formula [1] was produced according to a production method thereof described in Japanese Patent No. 3042618.

Reference Example 1

Synthesis of 5-acryloyloxy-2,6-norbornanecarbolactone 10 g (0.0653 mole) of 5-hydroxy-2,6-norbornanecarbolactone (H. B. Henbest et al., J. Chem. Soc., pp 221 to 226 (1959)), 9.49 g of N,N-dimethylaniline and 20 mg of phenothiazine were dissolved in 60 ml of dry THF, and the mixture was cooled with ice. Thereto was added dropwise 6.5 g of acryloyl chloride dissolved in 10 ml of dry THF. After stirring for 2 hours under cooling with ice and for 3 hours at a room temperature, the mixture was filtered and the filtrate was concentrated under reduced pressure. To the residue was added 250 ml of ether and the resultant was washed with 200 ml of 0.5 N hydrochloric acid, saturated saline, 200 ml of an aqueous 3% $NaHCO_3$ solution, saturated saline and water in that order. The ether layer was dried over $MgSO_4$ and ether was removed under reduced pressure, and the resulting precipitated white crystal was washed with 80 ml of hexane twice to give 5.38 g of an objective substance (white solid, yield 40%).

Reference Example 2

Synthesis of 5-methacryloyloxy-2,6-norbornanecarbolactone

Synthesis was conducted in the same manner as in Reference Example 1 except that methacryloyl chloride was used instead of acryloyl chloride (yield 20%).

Reference Example 3

Synthesis of 2-methyl-6-acryloyloxy-2,6-norbornanecarbolactone

Synthesis was conducted in the same manner as in Reference Example 1 except that 6-hydroxy-2,6-norbornanecarbolactone (S. Beckmann et al., Chem. Ber. vol 94, pp 48-58 (1961)) was used instead of 5-hydroxy-2,6-norbornanecarbolactone (yield 30%).

Reference Example 4

Synthesis of 2-methyl-6-methacryloyloxy-2,6-norbornanecarbolactone

Synthesis was conducted in the same manner as in Reference Example 3 except that methacryloyl chloride was used instead of acryloyl chloride (yield 25%).

Preparation Example 1

Preparation of Polymer Compound (1) in which y=0 and $R^1=R^2=H$ in the Formula [1]

In a 50 ml round-bottomed flask equipped with a reflux condenser, 3 g of acrylate obtained in Reference Example 1 was dissolved in 16 ml of dry THF. Thereto was added 79 mg (30 mmol/l) of AIBN, and stirring was conducted at 60 to 65° C. under argon atmosphere. After an hour, the reaction mixture was allowed to cool and poured into 200 ml of methanol, and the resulting precipitate was filtrated. Additional purification by reprecipitation was conducted to give 1.8 g of an objective substance (yield 60%, Mw=20000 (converted to polystyrene)).

Preparation Example 2

Preparation of Polymer Compound (5) in which $R^1=R^2=R^3=H$ $R^4$=3-tetracyclo[4.4.0.1$^{2.5}$.1$^{7.10}$]dodecyl group, x=0.7 and y=0.3 in the Formula [1]

In a 100 ml round-bottomed flask equipped with a reflux condenser, 2.5 g of acrylate obtained in Reference Example 1 and 1.71 g of tetracyclododecyl acrylate were dissolved in 23 ml of dry THF. Thereto was added 113 mg of AIBN (30 mmole/l), and stirring was conducted at 60 to 65° C. under argon atmosphere. After two hours, the reaction mixture was allowed to cool and poured into 400 ml of methanol, and the resulting precipitate was filtrated. Additional purification by reprecipitation was conducted to give 1.98 g of an objective substance (yield 47%, Mw=20000 (converted to polystyrene)). The ratio of copolymerization was x=0.7 and y=0.3 ($^1$H-NMR).

Preparation Examples 3 to 14

Preparation of Other Polymer Compounds (2) to (4) and (6) to (14)

Monomers and polymerization initiators were accordingly selected and the polymer compounds listed in Table 1 were prepared in the same manner as in Preparation Example 1 or Preparation Example 2. Herein, polymethylmethacrylate (PMMA, available from Wako Pure Chemical Industries, Ltd.) used in Comparative Examples 1 to 4 is also listed in Table 1.

TABLE 1

| polymer compound | x | y | Substituent | Mw |
|---|---|---|---|---|
| (1) | 1 | 0 | $R^1 = R^2 = H$ | 20000 |
| (2) | 1 | 0 | $R^1 =$ methyl $R^2 = H$ | 15000 |
| (3) | 1 | 0 | $R^1 = H, R^2 =$ methyl | 20000 |
| (4) | 1 | 0 | $R^1 = R^2 =$ methyl | 20000 |
| (5) | 0.7 | 0.3 | $R^1 = R^2 = R^3 = H$, $R^4 =$ tetracyclo[4.4.0.1$^{2,5}$.1$^{7,10}$]dodecyl | 20000 |
| (6) | 0.7 | 0.3 | $R^1 = R^2 = H, R^3 =$ methyl, $R^4 =$ tetracyclo[4.4.0.1$^{2,5}$.1$^{7,10}$]dodecyl | 15000 |
| (7) | 0.7 | 0.3 | $R^1 = R^2 = H, R^3 =$ methyl, $R^4 =$ 2-adamantyl | 180000 |
| (8) | 0.7 | 0.3 | $R^1 = R^2 = H, R^3 =$ methyl, $R^4 =$ tert-butyl | 230000 |
| (9) | 0.7 | 0.3 | $R^1 = R^2 = H, R^3 =$ methyl, $R^4 =$ norbornyl | 18000 |
| (10) | 0.6 | 0.4 | $R^1 = R^2 = R^3 = H$, $R^4 =$ 2-adamantyl | 220000 |
| (11) | 0.6 | 0.4 | $R^1 = R^2 = R^3 = H$, $R^4 =$ tetracyclo[4.4.0.1$^{2,5}$.1$^{7,10}$]dodecyl | 19000 |
| (12) | 0.6 | 0.4 | $R^1 = R^2 = R^3 = H$, $R^4 =$ tetracyclo[4.4.0.1$^{2,5}$.1$^{7,10}$]dodecyl | 22000 |
| (13) | 0.6 | 0.4 | $R^1 = R^2 = H, R^3 =$ methyl, $R^4 =$ tetracyclo[4.4.0.1$^{2,5}$.1$^{7,10}$]dodecyl | 23000 |
| (14) | 0.6 | 0.4 | $R^1 = R^2 = H, R^3 =$ methyl, $R^4 =$ 2-adamantyl | 22000 |
| PMMA | 0 | 1 | $R^3 = R^4 =$ methyl | 50000 |

Example 1

An organic TFT-A shown in FIG. 1 was produced by the following procedure. First, a chromium film was formed on a glass substrate 11 (board thickness 0.7 mm, product no.: 1737, available from Corning Incorporated) in a thickness of 100 nm by a vacuum deposition method to form a gate electrode 14. Subsequently, a film of the polymer compound (1) obtained in Preparation Example 1 was formed on the gate electrode 14 in a film thickness of 300 nm using a 1.5 wt % chloroform solution by a spin coat method (2000 rpm, 60 seconds) to form an insulator layer 16. Further, on the insulator layer 16, films of magnesium-silver alloy were formed in a film thickness of 100 nm in stripes through a metal mask to form a source electrode 12 and a drain electrode 13.

Then, a pentacene film was formed in a film thickness of 300 nm by a vacuum deposition method as an organic semiconductor layer 15, and an organic TFT 101 was obtained.

The mobility of pentacene and the on-off property of the obtained organic TFT 101 were measured, and the values were 0.7 cm$^2$/Vs and 10$^4$, respectively. As compared with Comparative Example 1 described below, improvements were found in the mobility and the on-off property.

Comparative Example 1

An organic TFT 102 was produced in exactly the same manner as in Example 1 except for using polymethylmethacrylate (Mw=50000, available from Wako Pure Chemical Industries, Ltd.) as an insulator layer material. The mobility of pentacene and the on-off property of the obtained organic TFT 102 were measured as in Example 1, and the values were 0.1 cm$^2$/Vs and 10$^3$, respectively, which were inferior to those of Example 1.

Examples 2 to 5

Organic TFTs 103 to 106 were produced in exactly the same manner as in Example 1 except that the compounds listed in Table 2 were used as insulator layer materials. The mobility of pentacene and the on-off property of the obtained organic TFTs 103 to 106 were measured as in Example 1. The results are shown in Table 2. All organic TFTs showed improvement in the mobility and the on-off property as compared with Comparative Example 1.

TABLE 2

| | polymer compound | | organic TFT | mobility | on-off property |
|---|---|---|---|---|---|
| | kind | Mw | No. | cm$^2$/Vs | |
| Ex. 2 | (2) | 15000 | 103 | 0.8 | 10$^5$ |
| Ex. 3 | (5) | 20000 | 104 | 0.6 | 10$^4$ |
| Ex. 4 | (7) | 180000 | 105 | 0.7 | 10$^4$ |
| Ex. 5 | (10) | 220000 | 106 | 0.6 | 10$^5$ |

Example 6

An organic TFT-B shown in FIG. 2 was fabricated by the following procedure. First, a chromium film was formed on a glass substrate 11 in a thickness of 30 nm by a vacuum deposition method and a gold film was formed thereon in a thickness of 70 nm by a vacuum deposition method to form a gate electrode 14. Subsequently, a film of the polymer compound (1) obtained in Preparation Example 1 was formed on the gate electrode 14 in a film thickness of 300 nm using a 1.5 wt % chloroform solution by a spin coat method (2000 rpm, 60 seconds) to form an insulator layer 16. Further, a pentacene film was formed in a thickness of 300 nm by a vacuum deposition method to form an organic semiconductor layer 15. Then, on the organic semiconductor layer 15, silver films were formed in a thickness of 100 nm in stripes through a metal mask by a vacuum deposition method to form a source electrode 12 and a drain electrode 13, and an organic TFT 201 was obtained.

The mobility of pentacene and the on-off property of the fabricated organic TFT 201 were measured, and the values were 0.9 cm$^2$/Vs and 10$^5$, respectively. As compared with Comparative Example 2 described below, improvements were found in the mobility and the on-off property.

Comparative Example 2

An organic TFT 202 was fabricated in exactly the same manner as in Example 6 except for using polymethylmethacrylate (Mw=50000) as an insulator layer material. The mobility of pentacene and the on-off property were measured as in Example 6, and the values were 0.08 cm$^2$/Vs and 10$^2$, respectively, which were inferior to those of Example 6.

Examples 7 to 10

Organic TFTs 203 to 206 were fabricated in exactly the same manner as in Example 6 except that the compounds listed in Table 3 were used as insulator layer materials. The mobility of pentacene and the on-off property were measured as in Example 6. The results are shown in Table 3. All organic TFTs showed improvement in the mobility and the on-off property as compared with Comparative Example 2.

TABLE 3

| polymer compound | | organic TFT | mobility | on-off |
|---|---|---|---|---|
| kind | Mw | No. | cm$^2$/Vs | property |
| Ex. 7 | (2) | 15000 | 203 | 0.7 | 10$^5$ |
| Ex. 8 | (5) | 20000 | 204 | 0.5 | 10$^4$ |
| Ex. 9 | (8) | 230000 | 205 | 0.9 | 10$^5$ |
| Ex. 10 | (11) | 19000 | 206 | 0.8 | 10$^5$ |

Example 11

An organic TFT-C shown in FIG. 3 was produced by the following procedure. First, a chromium film was formed on a glass substrate 11 in a thickness of 30 nm by a vacuum deposition method and a gold film was formed thereon in a thickness of 70 nm by a vacuum deposition method to form a gate electrode 14. Subsequently, a film of the polymer compound (1) obtained in Preparation Example 1 was formed on the gate electrode 14 in a film thickness of 300 nm using a 1.5 wt % chloroform solution by a spin coat method (2000 rpm, 60 seconds) to form an insulator layer 16. On the insulator layer 16, films of magnesium-silver alloy were formed in a thickness of 100 nm in stripes through a metal mask by a vacuum deposition method to form a source electrode 12. Further, a film of poly(3-hexylthiophene) was formed in a thickness of 100 nm using a 0.5 wt % toluene solution by a spin coat method (2000 rpm, 40 seconds) to form an organic semiconductor layer 15. Then, on the organic semiconductor layer 15, magnesium-silver films were formed in a thickness of 100 nm in stripes through a metal mask by a vacuum deposition method to form a drain electrode 13, and an organic TFT 301 was obtained.

The mobility of poly(3-hexylthiophene) and the on-off property of the obtained organic TFT 301 were measured, and the values were 0.01 cm$^2$/Vs and 10$^5$, respectively. As compared with Comparative Example 3 described below, improvements were found in the mobility and the on-off property.

Comparative Example 3

An organic TFT 302 was produced in exactly the same manner as in Example 11 except for using polymethylmethacrylate (Mw=50000) as an insulator layer material. Although measurement of the mobility of poly(3-hexylthiophene) and the on-off property of the obtained organic TFT 302 was attempted as in Example 11, the insulator layer was eroded by the solvent, i.e., toluene, when the organic semiconductor layer was formed. Thus, it was impossible to measure those properties.

Example 12 to 15

Organic TFTs 303 to 306 were produced in exactly the same manner as in Example 11 except that the compounds listed in Table 4 were used as insulator layer materials. The mobility of poly(3-hexylthiophene) and the on-off property of the obtained organic TFTs 303 to 306 were measured as in Example 11. The results are shown in Table 4. All organic TFTs showed excellent mobility and on-off property.

TABLE 4

| polymer compound | | organic TFT | mobility | on-off |
|---|---|---|---|---|
| kind | Mw | No. | cm$^2$/Vs | property |
| Ex. 12 | (3) | 20000 | 303 | 0.007 | 10$^4$ |
| Ex. 13 | (5) | 20000 | 304 | 0.008 | 10$^4$ |
| Ex. 14 | (9) | 18000 | 305 | 0.008 | 10$^5$ |
| Ex. 15 | (14) | 22000 | 306 | 0.009 | 10$^5$ |

Example 16

An organic TFT-D shown in FIG. 4 was produced by the following procedure. First, a chromium film was formed on a glass substrate 11 in a thickness of 30 nm by a vacuum deposition method and a gold film was formed thereon in a thickness of 70 nm by a vacuum deposition method to form a source electrode 12. Subsequently, on the source electrode 12, a copper phthalocyanine film was formed in a thickness of 100 nm by a vacuum deposition method to form an organic semiconductor layer 15 (lower part). A film of the polymer compound (1) obtained in Preparation Example 1 was formed on the organic semiconductor layer 15 (lower part) in a thickness of 10 nm using a 1.5 wt % chloroform solution by a stamping method employing a stripe stamp to form an insulator layer 16 (lower part). An aluminum film was formed in a thickness of 30 nm directly on the insulator layer 16 through a metal mask by a vacuum deposition method to form a gate electrode 14. Subsequently, a film of the polymer compound (1) was formed in a thickness of 10 nm directly on the gate electrode 14 using the aforementioned chloroform solution by a stamping method employing a stripe stamp to form an insulator layer 16 (upper part). Then, a copper phthalocyanine film was formed in a thickness of 100 nm by a vacuum deposition method as an organic semiconductor layer 15 (upper part). Lastly, a gold film was formed on the organic semiconductor layer 15 in a thickness of 100 nm through a metal mask by a vacuum deposition method to form a drain electrode 13, and an organic TFT 401 was obtained.

The mobility of copper phthalocyanine and the on-off property of the obtained organic TFT 401 were measured, and the values were 1.2×10$^{-5}$ cm$^2$/Vs and 10$^3$, respectively. As compared with Comparative Example 4 described below, improvements were found in the mobility and the on-off property.

Comparative Example 4

An organic TFT 402 was produced in exactly the same manner as in Example 16 except for using polymethylmethacrylate (Mw=50000) as an insulator layer material. The mobility of copper phthalocyanine and the on-off property of the obtained organic TFT 402 were measured as in Example 16, but modulation by the gate electrode was not found in the current value between the source electrode and the drain electrode.

Example 17 to 20

Organic TFTs 403 to 406 were produced in exactly the same manner as in Example 16 except that the polymer compounds listed in Table 5 were used as insulator layer materials. The mobility of copper phthalocyanine and the on-off property of the obtained TFTs 403 to 406 were measured as in Example 16. The results are shown in Table 5. All organic TFTs showed excellent mobility and on-off property.

TABLE 5

| | polymer compound | | organic TFT | mobility | on-off |
| --- | --- | --- | --- | --- | --- |
| | kind | Mw | No. | cm²/Vs | property |
| Ex. 17 | (4) | 20000 | 403 | $2.6 \times 10^{-5}$ | $10^2$ |
| Ex. 18 | (6) | 15000 | 404 | $0.5 \times 10^{-5}$ | $10^3$ |
| Ex. 19 | (12) | 22000 | 405 | $1.0 \times 10^{-5}$ | $10^2$ |
| Ex. 20 | (13) | 23000 | 406 | $5.6 \times 10^{-5}$ | $10^2$ |

The present invention has been described based on preferable embodiments, but the organic thin film transistor of the present invention is not limited to the constitutions described in the aforementioned embodiments. Organic thin film transistors with various modifications or alterations in the constitutions of the aforementioned embodiments are also included in the scope of the present invention.

The organic material having a bridged cyclic hydrocarbon lactone structure in the present invention enables lamination of layers by utilizing a difference in the solvent solubilities, and the material is useful for forming an insulator layer of an organic thin film transistor, and makes the film forming process simple and accurate. Accordingly, a thin layer transistor having high mobility and an excellent on-off property can be afforded, which means that the organic material has high industrial applicability.

What is claimed is:

1. A transistor having three electrodes in which an electric current between a first electrode and a second electrode is controlled by applying a voltage to a third electrode, wherein said transistor comprises an organic material having a bridged cyclic hydrocarbon lactone structure.

2. The transistor according to claim 1, wherein the organic material having a bridged cyclic hydrocarbon lactone structure is a polymer compound represented by the following formula [1]:

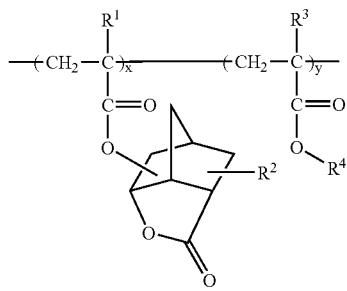

[1]

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying x+y=1, $0<x\leq1$ and $0\leq y<1$.

3. The transistor according to claim 2, wherein the polymer compound represented by the formula [1] is a compound in which y=0.

4. The transistor according to claim 1, wherein a gate insulator layer is formed of the organic material having a bridged cyclic hydrocarbon lactone structure.

5. The transistor according to claim 1, wherein a semiconductor material includes an organic material.

6. An organic thin film transistor having a structure comprising
a third electrode and an insulator layer on a substrate in that order,
a first electrode and a second electrode formed on the insulator layer at a predetermined interval of space, and
an organic semiconductor layer formed on the region of the insulator layer exposed between the first electrode and the second electrode so as to encompass a part of the respective surfaces of the first electrode and the second electrode,
wherein the insulator layer is formed of a polymer compound represented by formula [1]:

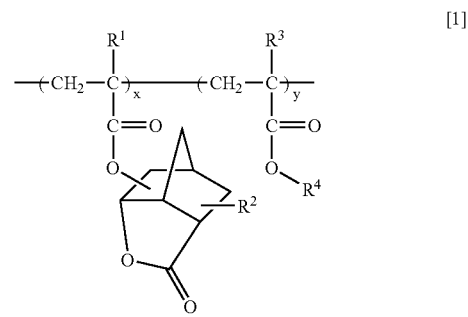

[1]

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying x+y=1, $0<x\leq1$ and $0\leq y<1$.

7. An organic thin film transistor comprising
a third electrode, an insulator layer and an organic semiconductor layer on a substrate in that order, and
a first electrode and a second electrode formed on the organic semiconductor layer at a predetermined interval of space, wherein the insulator layer is formed of a polymer compound represented by formula [1]:

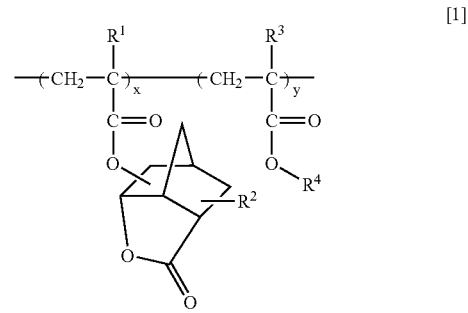

[1]

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying x+y=1, 0<x≦1 and 0≦y<1.

8. An organic thin film transistor comprising a third electrode and an insulator layer on a substrate in that order, a first electrode formed on the insulator layer, an organic semiconductor layer formed on the first electrode and the exposed region of the insulator layer so as to encompass a part of the surface of the first electrode and a second electrode formed on the organic semiconductor layer, wherein the insulator layer is formed of a polymer compound represented by formula [1]:

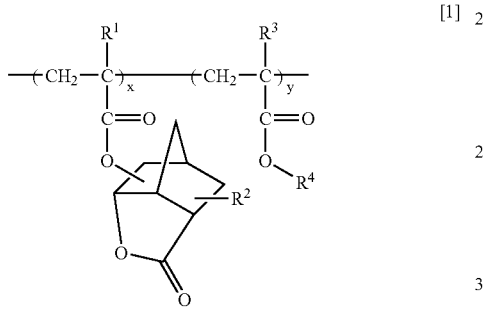

[1]

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying x+y=1, 0<x≦1 and 0≦y<1.

9. An organic thin film transistor having a structure comprising an organic semiconductor layer, a first electrode and a second electrode, the electrodes being formed to contact with the different surfaces of the organic semiconductor layer and to be opposed to each other at a predetermined interval of space and a third electrode formed at respective pre-determined distances from the first and the second electrodes, wherein an insulator layer is formed around the third electrode and wherein the insulator layer is formed of a polymer compound represented by formula [1]:

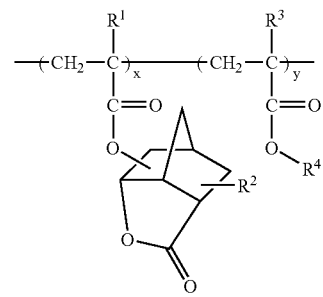

[1]

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying x+y=1, 0<x≦1 and 0≦y<1.

10. A process for producing an organic thin film transistor having an insulator layer formed of a polymer compound represented by formula [1], wherein the insulator layer is formed by using a solution of the polymer compound represented by formula [1]:

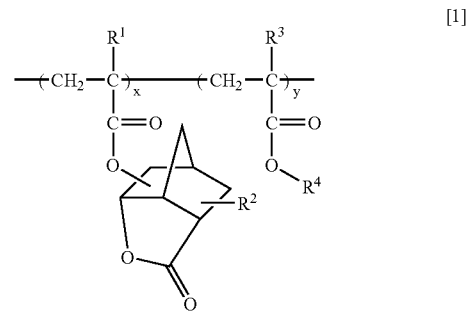

[1]

wherein $R^1$, $R^2$ and $R^3$ are each independently a hydrogen atom or a methyl group, $R^4$ is a hydrogen atom or a linear, branched or bridged cyclic hydrocarbon group having 1 to 12 carbon atoms, and x and y are molar ratio and are any number satisfying x+y=1, 0<x≦1 and 0≦y<1.

11. The process according to claim 10, wherein an organic semiconductor layer is formed by using a solution of the organic semiconductor material.

* * * * *